United States Patent
Cheng et al.

(10) Patent No.: US 10,366,881 B2
(45) Date of Patent: Jul. 30, 2019

(54) POROUS FIN AS COMPLIANT MEDIUM TO FORM DISLOCATION-FREE HETEROEPITAXIAL FILMS

(71) Applicant: INTERNATIONAL BUSINESS MACHINES CORPORATION, Armonk, NY (US)

(72) Inventors: Kangguo Cheng, Schenectady, NY (US); Keith E. Fogel, Hopewell Junction, NY (US); Jeehwan Kim, Cambridge, MA (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 254 days.

(21) Appl. No.: 15/468,864

(22) Filed: Mar. 24, 2017

(65) Prior Publication Data

US 2017/0200604 A1    Jul. 13, 2017

Related U.S. Application Data

(62) Division of application No. 14/812,797, filed on Jul. 29, 2015, now Pat. No. 9,646,832.

(51) Int. Cl.
   *H01L 21/30*    (2006.01)
   *H01L 21/02*    (2006.01)
   *H01L 29/267*   (2006.01)

(52) U.S. Cl.
   CPC .... *H01L 21/02428* (2013.01); *H01L 21/0245* (2013.01); *H01L 21/02381* (2013.01); *H01L 21/02494* (2013.01); *H01L 21/02521* (2013.01); *H01L 21/02639* (2013.01); *H01L 21/02658* (2013.01); *H01L 21/3003* (2013.01); *H01L 29/267* (2013.01); *H01L 21/0254* (2013.01)

(58) Field of Classification Search
   CPC ............. H01L 29/785; H01L 29/66795; H01L 21/845; H01L 21/823431; H01L 21/02428; H01L 21/02381; H01L 21/0245; H01L 21/02494; H01L 21/02521; H01L 21/02639; H01L 21/02658; H01L 21/3003; H01L 29/267; H01L 21/0254
   See application file for complete search history.

(56) References Cited

U.S. PATENT DOCUMENTS 7,638,381 B2    12/2009    Cheng et al.
7,847,323 B2    12/2010    Cheng et al.
(Continued)

OTHER PUBLICATIONS

List of IBM Patents or Patent Applications Treated as Related dated Mar. 24, 2017, 2 pages.

*Primary Examiner* — Roy Potter
(74) *Attorney, Agent, or Firm* — Tutunjian & Bitetto, P.C.; Louis J. Percello

(57) ABSTRACT

A method for forming a heteroepitaxial layer includes forming an epitaxial grown layer on a monocrystalline substrate and patterning the epitaxial grown layer to form fins. The fins are converted to porous fins. A surface of the porous fins is treated to make the surface suitable for epitaxial growth. Lattice mismatch is compensated for between an epitaxially grown monocrystalline layer grown on the surface and the monocrystalline substrate by relaxing the epitaxially grown monocrystalline layer using the porous fins to form a relaxed heteroepitaxial interface with the monocrystalline substrate.

10 Claims, 3 Drawing Sheets

(56) References Cited

U.S. PATENT DOCUMENTS

| | | |
|---|---|---|
| 8,021,949 B2 | 9/2011 | Cheng et al. |
| 8,912,602 B2 | 12/2014 | Hsu et al. |
| 9,711,416 B2 * | 7/2017 | Chan .................... H01L 21/845 |
| 2007/0082437 A1 * | 4/2007 | Cheng ............... H01L 29/66795 |
| | | 438/197 |
| 2007/0093036 A1 | 4/2007 | Cheng et al. |
| 2008/0283917 A1 | 11/2008 | Cheng et al. |
| 2016/0359044 A1 * | 12/2016 | Bedell ................. H01L 29/7851 |

* cited by examiner

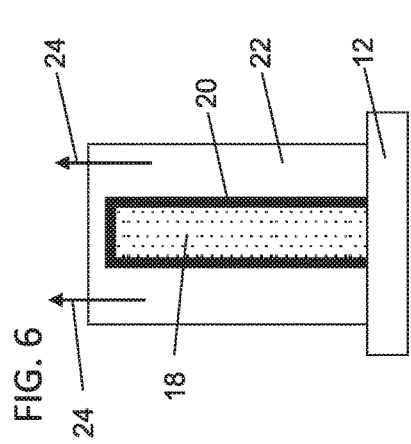
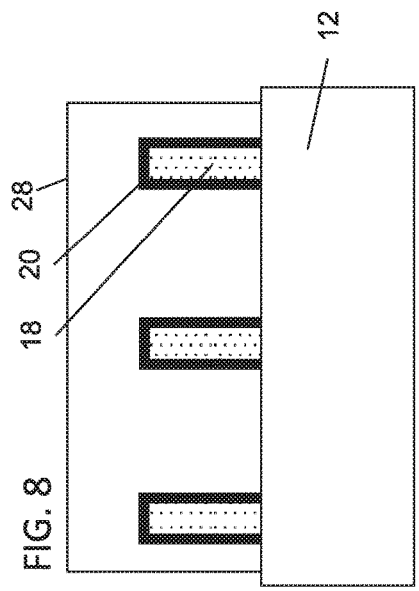
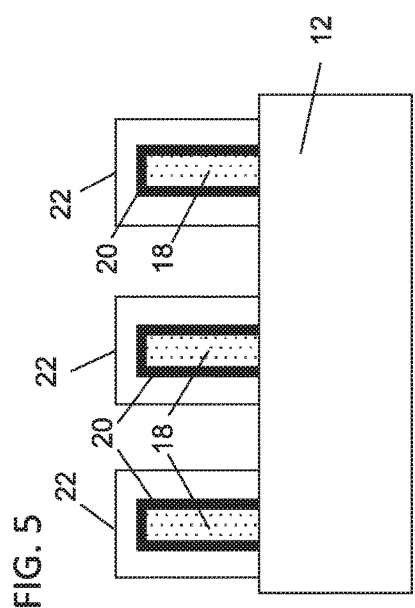
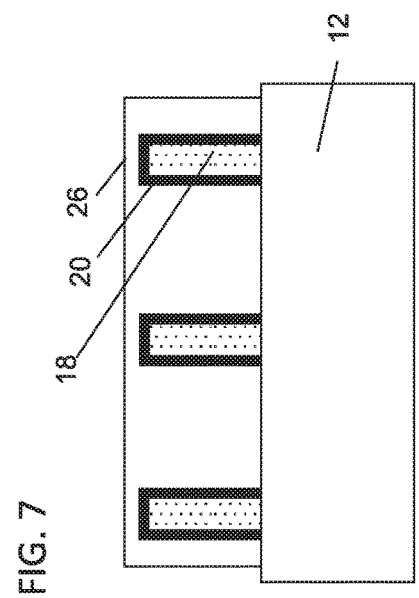

POROUS FIN AS COMPLIANT MEDIUM TO FORM DISLOCATION-FREE HETEROEPITAXIAL FILMS

BACKGROUND

Technical Field

The present invention relates to semiconductor processing, and more particularly to methods and devices that employ porous materials as a medium for addressing lattice mismatch between crystalline materials.

Description of the Related Art

Heteroepitaxy is the process of epitaxially growing one crystal on another. Since the crystal structures are usually different, issues can arise involving lattice mismatch between the different crystal structures. These differences are responsible for the formation of dislocation defects. Si wafers are preferred as a seed layer for growing other epitaxial films. Si is usually chosen due to cost-effectiveness considerations and due to its being a well-established material platform for thin film processing. Lattice mismatch between Si and other films induces dislocation-formation, which affects further fabrication and device performance.

SUMMARY

A method for forming a heteroepitaxial layer includes forming an epitaxial grown layer on a monocrystalline substrate and patterning the epitaxial grown layer to form fins. The fins are converted to porous fins. A surface of the porous fins is treated to make the surface suitable for epitaxial growth. Lattice mismatch is compensated for between an epitaxially grown monocrystalline layer grown on the surface and the monocrystalline substrate by relaxing the epitaxially grown monocrystalline layer using the porous fins to form a relaxed heteroepitaxial interface with the monocrystalline substrate.

Another method for forming a heteroepitaxial layer includes forming an epitaxial grown p+doped silicon layer on a monocrystalline silicon substrate; forming fins by patterning the epitaxial grown silicon layer wherein the fins are sized to provide compliance to permit an amount of relaxation; anodizing the fins to form porous silicon fins; performing a hydrogenation process on a surface of the porous silicon fins to make the surface suitable for epitaxial growth; growing an epitaxial monocrystalline layer on the surface; and relaxing the epitaxial monocrystalline layer by employing elasticity of the porous silicon fins.

A semiconductor device includes a porous fin formed on a monocrystalline substrate and a hydrogenated surface formed on the porous fin. An epitaxial monocrystalline layer is formed on the hydrogenated surface. The epitaxial monocrystalline layer includes a material other than a material of the substrate and forms a relaxed heteroepitaxial interface with the monocrystalline substrate.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 5 is a cross-sectional view of the substrate of FIG. 4 showing a monocrystalline epitaxial layer formed on the porous silicon fins in accordance with the present principles;

FIG. 6 is a magnified cross-sectional view of the substrate of FIG. 5 showing the monocrystalline epitaxial layer spontaneously relaxing using the compliance of the porous silicon fin in accordance with the present principles;

FIG. 7 is a cross-sectional view of the substrate of FIG. 5 showing the monocrystalline epitaxial layer being laterally expanded by epitaxial growth in accordance with the present principles;

FIG. 8 is a cross-sectional view of the substrate of FIG. 7 showing the monocrystalline epitaxial layer being vertically expanded by epitaxial growth in accordance with the present principles.

DETAILED DESCRIPTION

Figure 2:
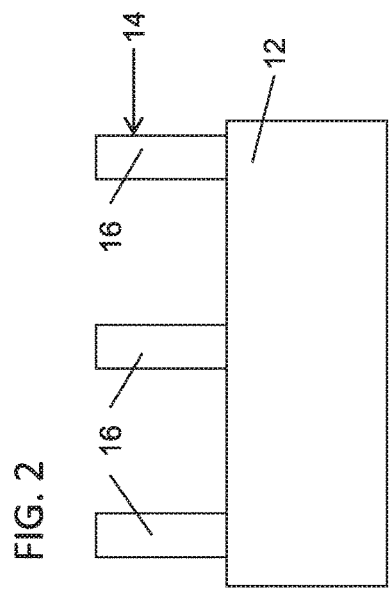
FIG. 2 is a cross-sectional view of the substrate of FIG. 1 wherein the p+doped layer is patterned to form fins therein in accordance with the present principles.

In accordance with the present principles, methods for heteroepitaxial growth and devices made by these methods are provided. The heteroepitaxial growth processes begin with a substrate, preferably of Si, and form fins on or in the substrate. The fins are converted to porous material (for example, porous Si (PS)) using, e.g., an anodizing process). Then, the fins are processed to form a surface layer suitable for continued epitaxial growth. In one embodiment, the porous Si fins are treated using a hydrogenation process to form a continuous Si shell on the porous Si fins. An epitaxial process is employed to grow a different crystalline material on the surface of the fins.

The different crystalline material is relaxed by the compliance of the porous material of the fin. For example, an elastic modulus of porous Si is a fraction (e.g., between about ⅓ to about ⅕) of typical semiconductor materials. The compliance of the fins relaxes the different crystalline material. In this way, dislocation defects from lattice mismatch are reduced or eliminated.

Porous Si fins can be semi-freestanding bodies to accommodate lattice mismatch with other epilayers formed thereon. By controlling a thickness ratio between porous Si fins and the epilayers formed thereon, strain in the epilayer can be fully-relaxed. Porous Si can be stretched or shrunk to follow the lattice of epilayers. In this way, spontaneous relaxation of the porous Si can prevent dislocation formation.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may be employed in a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., GaN. These compounds include different proportions of the elements within the compound, e.g., GaN includes $Ga_xNi_{1-x}$ where x is less than or equal to 1, etc. In addition, other elements may be included in the compound, such as, e.g., AlGaN, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
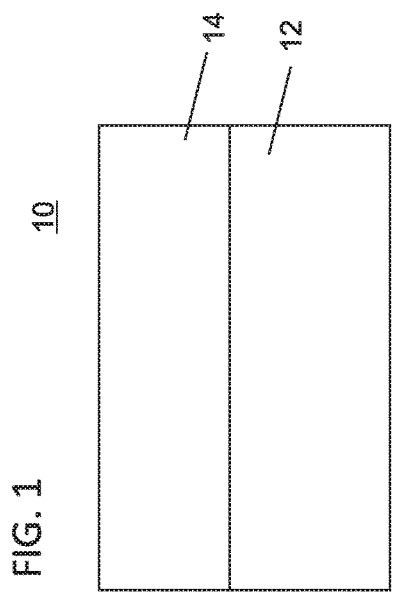
FIG. 1 is a cross-sectional view of a substrate having a p+doped layer epitaxially grown therein in accordance with the present principles.

Referring now to the drawings in which like numerals represent the same or similar elements and initially to FIG. 1, a partially fabricated semiconductor device 10 is illustratively shown in accordance with one embodiment. Device 10 includes a substrate 12, which preferably includes monocrystalline material. The substrate 12 may include Si, although other substrate materials may be employed, e.g., SiGe, SiC, Ge, III-V materials, II-VI materials, etc. An epitaxially grown layer (epilayer) 14 is formed on the substrate 12. In one embodiment, the epilayer 14 includes a p+doped silicon material (e.g., p+ refers to p-type dopants with a doping concentration greater than $5\times10^{18}/cm^3$). The epilayer 14 preferably includes Si for the formation of porous Si; however, the epilayer 14 may include other materials as well. For example, porous forms of Ge or III-V materials may also be employed. For simplicity, further description will focus on an illustrative porous Si embodiment; however, other materials may be employed.

Referring to FIG. 2, the epilayer 14 is patterned to form fins 16. The fins 16 are preferably patterned using a lithographic mask and etching process. The fins 16 are etched using a reactive ion etching process, although other types of etching processes may be employed. The dimensions of the fins 16 are determined based upon a thickness ratio that will be employed in ensuring an amount of relaxation of an epitaxial grown layer on the fin 16. For example, a fin's dimensions may be determined based on the amount of compliance needed. In one embodiment, a thickness of a fin is needed to be less than its height. For example, if the height is 30 nm or more, the thickness should be 30 nm or less.

Figure 3:
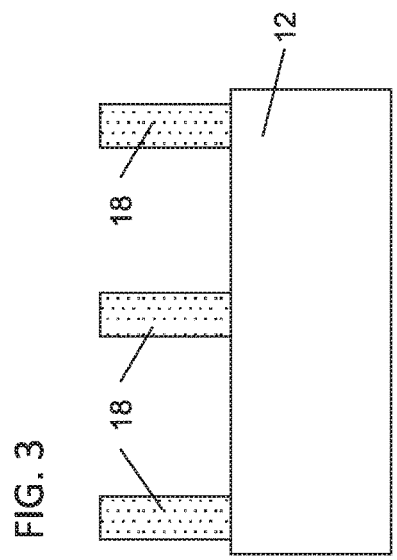
FIG. 3 is a cross-sectional view of the substrate of FIG. 2 showing the p+doped fins converted to porous silicon by a conversion process such as anodization in accordance with the present principles.

Referring to FIG. 3, the fins 16 are converted to porous silicon (PS) fins 18. The conversion may be performed by employing an anodization process, strain etching, drying or other techniques. In a particularly useful embodiment, anodization is employed. An anodization cell is employed that may include a cathode (e.g., platinum) and the doped silicon fins 16 as an anode. In one embodiment, the fins 16 are immersed in an HF electrolyte. Corrosion of the anode is produced by running electric current, preferably direct current (DC), through the cell to ensure a more homogenous porosity. The porosity of the fins 18 may be 40% or more, although other porosities may also be employed.

Figure 4:
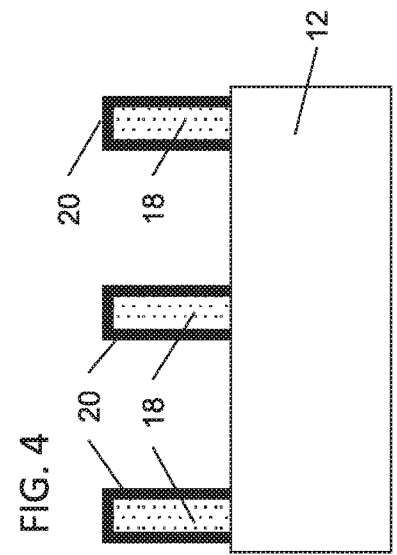
FIG. 4 is a cross-sectional view of the substrate of FIG. 3 showing the fins converted to porous silicon being treated to form a surface suitable for epitaxial growth in accordance with the present principles.

Referring to FIG. 4, the porous silicon fins 18 are treated to provide a surface suitable for epitaxial growth. In one embodiment, the porous silicon of fins 18 is exposed to a hydrogenation process. The hydrogenation process exposes the porous silicon fins 18 to hydrogen to provide a continuous silicon surface 20 on exterior portions of the fins 18. The hydrogenation process includes exposing the porous silicon to hydrogen ions at a temperature of between about 500 degrees C. and about 900 degrees C. to remove the pores on the surface.

The hydrogenation process includes annealing in an environment containing hydrogen. Si atoms at surfaces reflow to seal the pores at the surface to form a continuous Si layer (like the surface of single crystalline silicon). In illustrative embodiments, temperature, hydrogen pressure and annealing time are processing parameters that can be controlled to achieve a suitable surface 20 on the fins 18. The pressure may range from about 50 milli-Torr to about 100 Torr. The annealing time may range from about 5 seconds to about 200 seconds.

Referring to FIG. 5, the continuous surface 20 is suitable for epitaxial growth. An epitaxial layer 22 is grown on the continuous surface 20. The thickness ratio between the fins 18 and the epitaxial layer 22 is based upon the material being grown. The fin material 18 needs to have sufficient dimensions to fully (or partially) relax the material of the epitaxial layer 22. For example, if the material being grown (epitaxial layer 22) needs a 1% strain to be relaxed, the dimensions of the fin needs to be able to provide the 1% compliance to achieve full relaxation. It may be useful in some embodiments to maintain a portion of the strain depending upon the particular application.

Referring to FIG. 6, the epitaxial layer 22 grown may include, e.g., GaN. The strain in the GaN layer 22 is relieved by stretching the fins 18 in the direction of arrows 24. GaN stretches because the porous silicon core has a very low Young's modulus and thus high compliance. The fins 18 need to be able to handle at least the relaxation deflection. In other embodiments, the direction of relaxation may be perpendicular to arrows 24. In still other embodiments, the relaxation may be in multiple directions. The thickness ratio between the fins 18 (fin thickness) and the epitaxial layer (22) thickness may be between about 2:1 to about 1:5.

Referring to FIG. 7, in one embodiment, the epitaxial layer 22 may be formed and employed as depicted in FIG. 6. In other embodiments, the epitaxial growth process may be continued to laterally grow the epitaxial material to form a layer 26 of epitaxially grown material that fills in spaces between the fins 18. The layer 26 may be employed in forming diodes, photovoltaic devices, lasers, transistors, etc.

Referring to FIG. 8, in another embodiment, the epitaxial growth process may be continued to vertically grow the epitaxial material to form a thicker layer 28 of epitaxially grown material. The layer 28 may be employed in forming diodes, photovoltaic devices, lasers, transistors, etc. The exemplary structures of FIG. 6, FIG. 7 and FIG. 8 are grown dislocation-free using the compliant fins 18 formed from porous silicon.

It should be understood that porous silicon may be replaced with other compliant materials that can bond with a substrate and can form a surface suitable for epitaxial growth. Examples may include porous Ge, porous III-V material, etc.

The epitaxial layer 22 may include any epitaxially grown material. Examples may include II-VI materials, III-V materials, IV-IV materials, etc. Specific examples of the epitaxial layer 22 may include GaN, AN, ZnO, SiC, InN, BeSe, ZnS, MgS, BeTe, MgSe, AlP, GaP, AlAs, ZnSe, Si, Ge, InP, GaAs, CdSe, ZnTe, InGaAs, etc. These and other materials may be grown dislocation free using spontaneous relation processes in accordance with the present principles.

Figure 9:
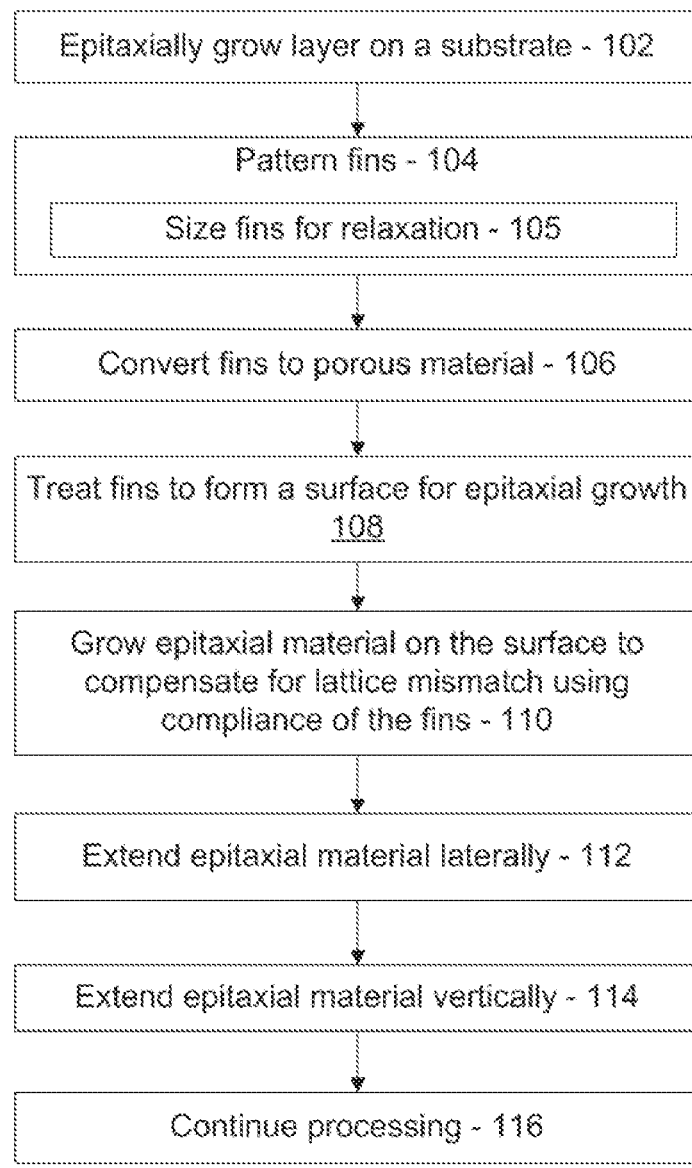
FIG. 9 is a block/flow diagram shows methods for forming a heteroepitaxial layer in accordance with the present principles.

Referring to FIG. 9, methods for forming a heteroepitaxial layer are illustratively depicted. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, an epitaxial grown layer is formed on a monocrystalline substrate. The epitaxial grown layer preferably includes a same material as the substrate. The epitaxial grown layer may be doped (e.g., with p-type dopants such as boron with a doping concentration greater than $5 \times 10^{18}/cm^3$) to enhance its anodic properties (over the substrate) if an anodizing process is layer employed. Since Si is a commonly processed material, in one embodiment, the substrate and the epitaxial grown layer include monocrystalline silicon, although other materials may be employed. In block 104, the epitaxial grown layer is patterned to form fins. The patterning process may include lithography. In other embodiments, the fins may be selectively grown on the substrate, e.g., epitaxially grown through a patterned layer. Other processes for forming the fins may also be employed. In block 105, the fins are sized to provide compliance to permit an amount of relaxation of the epitaxially grown monocrystalline layer.

In block 106, the fins are converted to porous fins. The conversion process may include anodization, strain etching, drying or other techniques, with anodization being preferred (using the fins as an anode). In block 108, a surface of the porous fins is treated to make the surface suitable for epitaxial growth. Treating the surface of the porous fins may include performing a hydrogenation process to form a continuous surface. Other suitable processes may also be employed.

In block 110, an epitaxial monocrystalline layer is grown on the surface wherein lattice mismatch is compensated for between the epitaxially grown monocrystalline layer grown on the surface and the substrate, by relaxing the epitaxially grown monocrystalline layer using the porous fins. The porous fins provide compliance to form a relaxed heteroepitaxial interface with the monocrystalline substrate. The elasticity of the porous silicon fins is employed as a relaxation medium. Compensation for lattice mismatch or relaxation of strain may include stretching or shrinking the porous fins to relax the epitaxially grown monocrystalline layer.

In block 112, the epitaxially grown monocrystalline layer may be extended by lateral growth to form a continuous layer. In block 114, the epitaxially grown monocrystalline layer may be vertically grown to form a thicker layer. If combined with block 112, a thicker horizontally continuous dislocation-free epitaxially grown monocrystalline layer can be provided. In block 116, processing may continue to from a device or devices. For example, the epitaxially grown monocrystalline layer may be employed to form any type of device that employs or would be desirable to employ a heteroepitaxial interface. These devices may include, e.g., transistors, diodes, lasers, etc.

Having described preferred embodiments porous fin as compliant medium to form dislocation-free heteroepitaxial films (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
   a porous fin formed on a monocrystalline substrate;
   a hydrogenated surface formed on the porous fin; and
   an epitaxial monocrystalline layer formed on the hydrogenated surface, the epitaxial monocrystalline layer including a material other than a material of the monocrystalline substrate and forming a relaxed heteroepitaxial interface with the monocrystalline substrate wherein a thickness of the porous fin and a thickness of the epitaxial monocrystalline layer include a thickness ratio configured to relax strain in the epitaxial monocrystalline layer.

2. The semiconductor device as recited in claim 1, wherein the epitaxial monocrystalline layer includes laterally grown portions to form a continuous layer of the epitaxial monocrystalline layer between the porous fins.

3. The semiconductor device as recited in claim 2, wherein the epitaxial monocrystalline layer includes a vertically grown portion of the epitaxially grown monocrystalline layer to form a thicker layer.

4. The semiconductor device as recited in claim 1, wherein the device includes a transistor, diode or laser.

5. The semiconductor device as recited in claim 1, wherein the epitaxial monocrystalline layer is free of dislocation defects.

6. The semiconductor device as recited in claim 1, wherein the porous fins include one of porous silicon, porous Ge, or a porous III-V material.

7. The semiconductor device as recited in claim 1, wherein a porosity of the porous fins is greater than about 40%.

8. The semiconductor device as recited in claim 1, wherein a thickness ratio between the porous fin and an epitaxial monocrystalline layer is between about 2:1 to about 1:5.

9. A semiconductor device, comprising:
   a porous fin formed on a monocrystalline substrate, wherein the porous fins include one of porous silicon, porous Ge, or a porous III-V material;
   a hydrogenated surface formed on the porous fin; and
   an epitaxial monocrystalline layer formed on the hydrogenated surface, the epitaxial monocrystalline layer including a material other than a material of the monocrystalline substrate and forming a relaxed heteroepitaxial interface with the monocrystalline substrate.

10. A semiconductor device, comprising:
    a porous fin formed on a monocrystalline substrate;
    a hydrogenated surface formed on the porous fin; and
    an epitaxial monocrystalline layer formed on the hydrogenated surface, the epitaxial monocrystalline layer including a material other than a material of the monocrystalline substrate and forming a relaxed heteroepitaxial interface with the monocrystalline substrate, wherein the semiconductor device includes a transistor, diode or laser.

* * * * *